(12) United States Patent
Lu

(10) Patent No.: US 11,366,350 B2
(45) Date of Patent: Jun. 21, 2022

(54) LIQUID CRYSTAL DISPLAY PANEL AND LIQUID CRYSTAL DISPLAY DEVICE

(71) Applicant: Wuhan China Star Optoelectronics Technology Co., Ltd., Hubei (CN)

(72) Inventor: Peng Lu, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 575 days.

(21) Appl. No.: 16/472,883

(22) PCT Filed: Jan. 16, 2019

(86) PCT No.: PCT/CN2019/071849
§ 371 (c)(1),
(2) Date: Jun. 23, 2019

(87) PCT Pub. No.: WO2020/107677
PCT Pub. Date: Jun. 4, 2020

(65) Prior Publication Data
US 2020/0409196 A1    Dec. 31, 2020

(30) Foreign Application Priority Data

Nov. 30, 2018 (CN) .......................... 201811458800.2

(51) Int. Cl.
*G02F 1/1333* (2006.01)
*G02F 1/1335* (2006.01)
(Continued)

(52) U.S. Cl.
CPC ...... *G02F 1/13338* (2013.01); *G02F 1/13312* (2021.01); *G02F 1/133514* (2013.01);
(Continued)

(58) Field of Classification Search
CPC .... G06V 40/12; G06V 40/13; G06V 40/1318; G02F 1/13338; G02F 2201/58; G02F 1/136209; G02F 1/133512
See application file for complete search history.

(56) References Cited

U.S. PATENT DOCUMENTS

2006/0017862 A1    1/2006  Song et al.
2010/0231495 A1    9/2010  Kang et al.
(Continued)

FOREIGN PATENT DOCUMENTS

CN          1689025 A    10/2005
CN        105336751 A     2/2016
(Continued)

*Primary Examiner* — Jessica M Merlin
(74) *Attorney, Agent, or Firm* — Hamre, Schumann, Mueller & Larson, P.C.

(57) ABSTRACT

The present application provides a liquid crystal display panel and an liquid crystal display device, which includes an array substrate, a color film substrate, liquid crystals, and a fingerprint identification module, the array substrate is disposed on one side facing the user; the liquid crystal is positioned between the array substrate and the color film substrate; the fingerprint identification module is formed on one side of the array substrate facing the liquid crystal; the fingerprint identification module includes a thin film transistor and a photodiode for convert light energy into electrical energy, the thin film transistor is electrically connected to an output end of the photodiode.

15 Claims, 2 Drawing Sheets

(51) Int. Cl.
*H01L 27/146* (2006.01)
*H01L 27/30* (2006.01)
*G06V 40/12* (2022.01)
*G06V 40/13* (2022.01)
*G02F 1/133* (2006.01)
*G02F 1/1362* (2006.01)

(52) U.S. Cl.
CPC ...... *G06V 40/1318* (2022.01); *G06V 40/1365* (2022.01); *H01L 27/14678* (2013.01); *H01L 27/307* (2013.01); *G02F 1/136209* (2013.01); *G02F 2201/58* (2013.01)

(56) References Cited

U.S. PATENT DOCUMENTS

| | | |
|---|---|---|
| 2018/0059452 A1 | 3/2018 | Jang |
| 2018/0076256 A1 | 3/2018 | Jiang et al. |
| 2018/0217430 A1 | 8/2018 | Ding et al. |
| 2019/0005295 A1 | 1/2019 | Jia et al. |
| 2019/0065809 A1 | 2/2019 | Li et al. |
| 2019/0080141 A1 | 3/2019 | Tan |
| 2020/0134281 A1 | 4/2020 | Han et al. |

FOREIGN PATENT DOCUMENTS

| | | |
|---|---|---|
| CN | 105678255 A | 6/2016 |
| CN | 105975136 A | 9/2016 |
| CN | 105975963 A | 9/2016 |
| CN | 106022276 A | 10/2016 |
| CN | 205656407 U | 10/2016 |
| CN | 106096595 A | 11/2016 |
| CN | 106249457 A | 12/2016 |
| CN | 106355160 A | 1/2017 |
| CN | 106611170 A | 5/2017 |
| CN | 106684202 A | 5/2017 |
| CN | 106959757 A | 7/2017 |
| CN | 106970495 A | 7/2017 |
| CN | 107765476 A | 3/2018 |
| CN | 107885002 A | 4/2018 |
| CN | 108415188 A | 8/2018 |

LIQUID CRYSTAL DISPLAY PANEL AND LIQUID CRYSTAL DISPLAY DEVICE

CROSS REFERENCE TO RELATED APPLICATION

This application claims the priority of International Application No. PCT/CN2019/071849, filed on Jan. 16, 2019, which claims priority to Chinese Application No. 201811458800.2, filed on Nov. 30, 2018. The entire disclosures of each of the above applications are incorporated herein by reference.

BACKGROUND OF INVENTION

Field of Invention

The present application relates to a display technology, and particularly to a liquid crystal display panel and a liquid crystal display device.

Description of Prior Art

At present, fingerprint unlock function is widely used in display products in daily life, a conventional fingerprint unlock button is generally configured in a non-display area, and a full screen display has become a big development trend in the future, where in-screen fingerprint unlock function will be more and more used in products. An optical fingerprint identification is the best way to achieve in-screen fingerprint unlock. In conventional LCD products, referring to FIG. 1, light needs to penetrate through a color film substrate from a array substrate to reach a finger, and light reflected by the finger penetrates from the color film substrate to the optical fingerprint identification module configured on the array substrate, and which is then detected by the photodiode, but the light intensity detected by such a light path is very weak and sensitivity is very poor.

SUMMARY OF INVENTION

The present application provides a liquid crystal display panel and a liquid crystal display device, to solve the problem that light needs to penetrate through a color film substrate from a array substrate to reach a finger, and light reflected by the finger penetrates from the color film substrate to the optical fingerprint identification module configured on the array substrate, and then which is detected by the photodiode, the light intensity detected by such a light path is very weak, and a sensitivity is very poor.

The present application provides a liquid crystal display panel, includes:

an array substrate disposed at one side facing an user of the liquid crystal display panel;

a color film substrate disposed at one side facing away from the user;

liquid crystals positioned between the array substrate and the color film substrate; and a fingerprint identification module formed on one side of the array substrate facing the liquid crystal to shorten paths of light reflected by a finger to a photodiode of the fingerprint identification module;

wherein the fingerprint identification module includes a thin film transistor and the photodiode configured for converting light energy into electrical energy, the thin-film transistor is electrically connected to an output end of the photodiode;

wherein the thin film transistor includes a base, and a gate electrode, an insulating layer, an active layer, a source/drain electrode, a first passivation layer, a second passivation layer and a first shading layer successively formed on one side of the base facing the color film substrate;

wherein the photodiode includes the base, and the insulating layer, a source/drain electrode layer, an N-type layer, an intermediate layer, a P-type layer, a contact electrode, a third passivation layer and a second shading layer successively formed on the base;

wherein the contact electrode and the third passivation layer are successively formed on the first shading layer;

wherein the source/drain electrode and the source/drain electrode layer are electrically connected together and formed on a same layer, and the first shading layer is configured to block light from reaching the thin film transistor and some parts of the second passivation layer which do not need light irradiation, and the second shading layer is configured to block the photodiode from light;

wherein the thin film transistor further includes a third shading layer, the third shading layer is formed between the gate electrode and the base, and the third shading layer is configured to block light from reaching the thin film transistor and some parts of the first passivation layer which do not need light irradiation; and wherein the intermediate layer is made of one of Si-based material, organic o-phenylenediamine (OPD), and perovskite.

In the liquid crystal display panel of the present application, the intermediate layer is made of perovskite, and a thickness of the intermediate layer is between 250 nanometers and 3 microns.

In the liquid crystal display panel of the present application, the N-type layer is a layer containing one electron transport material or several electron transport materials.

In the liquid crystal display panel of the present application, the P-type layer is a hole transport material layer, the hole transport material is a single hole transport compound or element, or a mixture containing two or more hole transport compound or elements.

In the liquid crystal display panel of the present application, wherein the intermediate layer includes at least one kind of anions obtained from halogenated anions and sulfide anions.

The present application also provides a liquid crystal display panel, includes:

an array substrate disposed at one side facing an user of the liquid crystal display panel;

a color film substrate disposed at one side facing away from the user;

liquid crystals positioned between the array substrate and the color film substrate; and a fingerprint identification module formed on one side of the array substrate facing the liquid crystal to shorten paths of light reflected by a finger to a photodiode of the fingerprint identification module;

wherein the fingerprint identification module includes a thin film transistor and the photodiode configured for converting light energy into electrical energy, the thin-film transistor is electrically connected to an output end of the photodiode.

In the liquid crystal display panel of the present application, the thin film transistor includes a base, and a gate electrode, an insulating layer, an active layer, a source/drain electrode, a first passivation layer, a second passivation layer and a first shading layer successively formed on one side of the base facing the color film substrate;

wherein the photodiode includes the base, and the insulating layer, a source/drain electrode layer, an N-type layer, an intermediate layer, a P-type layer, a contact electrode, a third passivation layer and a second shading layer successively formed on the base;

wherein the contact electrode and the third passivation layer are successively formed on the first shading layer;

wherein the source/drain electrode and the source/drain electrode layer are electrically connected together and formed on a same layer, and the first shading layer is configured to block light from reaching the thin film transistor and some parts of the second passivation layer which do not need light irradiation, and the second shading layer is configured to block the photodiode from light.

In the liquid crystal display panel of the present application, the thin film transistor further includes a third shading layer, the third shading layer is formed between the gate electrode and the base, and the third shading layer is configured to block light from reaching the thin film transistor and some parts of the first passivation layer which do not need light irradiation.

In the liquid crystal display panel of the present application, the intermediate layer is made of one of Si-based material, organic o-phenylenediamine (OPD), and perovskite.

In the liquid crystal display panel of the present application, the intermediate layer is made of perovskite, and a thickness of the intermediate layer is between 250 nanometers and 3 microns.

The present application also provides a liquid crystal display device including a liquid crystal panel and a light source, wherein the liquid crystal panel includes:

an array substrate disposed at one side facing an user of the liquid crystal display panel;

a color film substrate disposed at one side facing away from the user;

liquid crystals positioned between the array substrate and the color film substrate; and a fingerprint identification module formed on one side of the array substrate facing the liquid crystal to shorten paths of light reflected by a finger to a photodiode of the fingerprint identification module;

wherein the fingerprint identification module includes a thin film transistor and the photodiode configured for converting light energy into electrical energy, the thin-film transistor is electrically connected to an output end of the photodiode.

In the liquid crystal display device of the present application, the thin film transistor includes a base, and a gate electrode, an insulating layer, an active layer, a source/drain electrode, a first passivation layer, a second passivation layer and a first shading layer successively formed on one side of the base facing the color film substrate;

wherein the photodiode includes the base, and the insulating layer, a source/drain electrode layer, an N-type layer, an intermediate layer, a P-type layer, a contact electrode, a third passivation layer and a second shading layer successively formed on the base;

wherein the contact electrode and the third passivation layer are successively formed on the first shading layer;

wherein the source/drain electrode and the source/drain electrode layer are electrically connected together and formed on a same layer, and the first shading layer is configured to block light from reaching the thin film transistor and some parts of the second passivation layer which do not need light irradiation, and the second shading layer is configured to block the photodiode from light.

In the liquid crystal display device of the present application, the thin film transistor further includes a third shading layer, the third shading layer is formed between the gate electrode and the base, and the third shading layer is configured to block light from reaching the thin film transistor and some parts of the first passivation layer which do not need light irradiation.

In the liquid crystal display device of the present application, the intermediate layer is made of one of Si-based material, organic o-phenylenediamine (OPD), and perovskite.

In the liquid crystal display device of the present application, the intermediate layer is made of perovskite, and a thickness of the intermediate layer is between 250 nanometers and 3 microns.

The beneficial effect is: compared with the liquid crystal display panel of prior art, in the liquid crystal display panel and the liquid crystal display device of the present application, the array substrate with the fingerprint identification modules is positioned to face the user, that is to shorten paths of light reflected from the finger and to improve the sensitivity of the fingerprint identification module; furthermore, the first shading layer and the second shading layer are configured to prevent from the backlight reaching to the photodiodes to cause a misjudgment of the photodiodes; the third shading layer is configured to prevent from the metal reflecting light, such as the gate electrodes, the source/drain electrodes, and so on. Solving the problem that light needs to penetrate through a color film substrate from a array substrate to reach a finger, and light reflected by the finger penetrates from the color film substrate to the optical fingerprint identification module configured on the array substrate, and then which is detected by the photodiode, the light intensity detected by such a light path is very weak, and a sensitivity is very poor.

BRIEF DESCRIPTION OF DRAWINGS

In order to more clearly illustrate the embodiments of the present application or the technical solutions in the prior art, the drawings used in the embodiments will be briefly described below. The drawings in the following description are only partial embodiments of the present application, and those skilled in the art can obtain other drawings according to the drawings without any creative work.

DETAILED DESCRIPTION OF PREFERRED EMBODIMENTS

Figure 1:
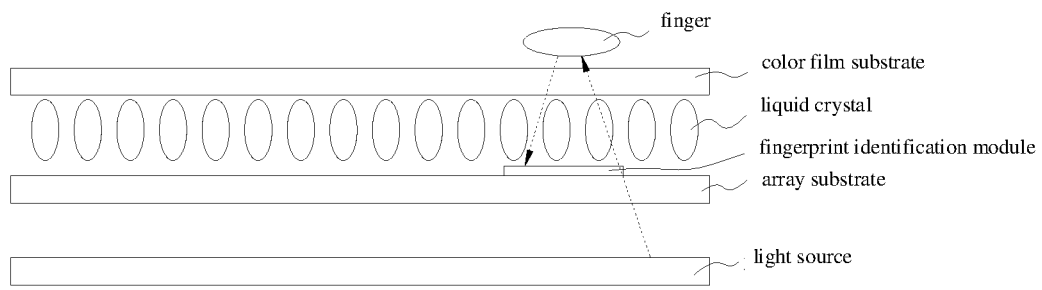
FIG. 1 is a structural schematic view of a liquid crystal display device of prior art.

Referring to the drawings, in which the same reference numerals represent the same components. The following description is based on the specific embodiments of the present invention as illustrated, and should not be construed as limiting the specific embodiments that are not described herein.

Figure 2:
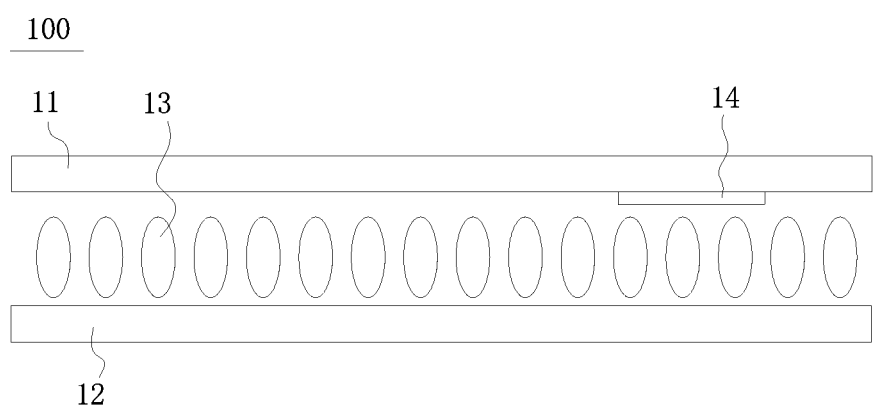
FIG. 2 is a structural schematic view of a liquid crystal display panel of one exemplary embodiment of the present disclosure.
Figure 3:
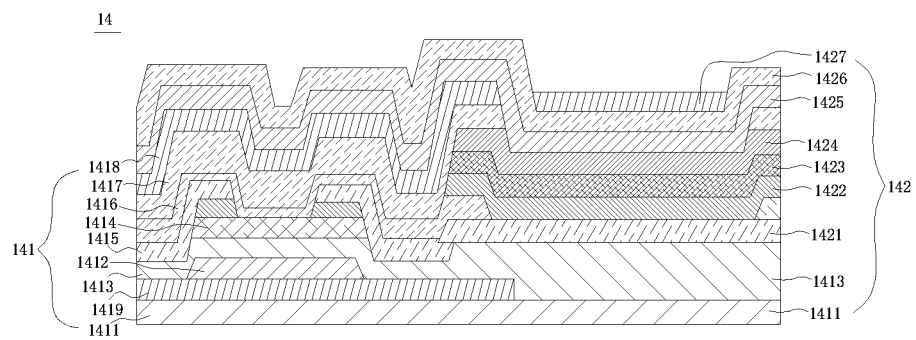
FIG. 3 is a structural schematic view of a finger identification module of a liquid crystal display panel of one exemplary embodiment of the present disclosure.

Referring to FIG. 2 and FIG. 3, FIG. 2 is a structural schematic view of a liquid crystal display panel of one exemplary embodiment of the present disclosure; FIG. 3 is a structural schematic view of a finger identification module of a liquid crystal display panel of one exemplary embodiment of the present disclosure. A liquid crystal display panel 100 of the present embodiment includes an array substrate 11, a color film substrate 12, liquid crystals 13, and a fingerprint identification module 14.

The array substrate 11 is disposed on one side of facing a user. The color film substrate 12 is disposed on one side of back to the user. The liquid crystal 11 is positioned between the array substrate 11 and the color film substrate 12. The fingerprint identification module 14 is formed on one side of the array substrate 11 facing the liquid crystal 13, and that is to shorten paths of light reflected by a finger to a photodiode of the fingerprint identification module 142.

The fingerprint identification module 14 includes a thin film transistor 141 and a photodiode 142 configured for converting light energy into electrical energy. The thin film transistor 141 is electrically connected to an output end of the photodiode 142.

The fingerprint identification module 14 is formed in a display region of the liquid crystal display panel 100.

The liquid crystal display panel 100 of the present application is provided by forming the array substrate 11 which configures the fingerprint identification modules 14 positioned to face the user, that is to shorten the paths of light reflected by the finger and to reduce a loss of light intensity, and that is to improve the sensitivity of the fingerprint identification module 14.

Furthermore, the fingerprint identification module 14 is disposed on the array substrate 11 to make the thin film transistor 141 of the fingerprint identification module 14 and the thin film transistor of the array substrate 11 to be manufactured by a same process, and that is to save a manufacturing time and improve a manufacturing efficiency. Both of them share one base 1411 to save materials.

Referring to FIG. 3, FIG. 3 is a structural schematic view of a finger identification module of a liquid crystal display panel of one exemplary embodiment of the present disclosure. In one exemplary embodiment of the present liquid crystal display panel 100, a thin film transistor 141 includes a base 1411, and a gate electrode 1412, an insulating layer 1413, an active layer 1414, a source/drain electrode 1415, a first passivation layer 1416, a second passivation layer 1417, and a first shading layer 1418 successively formed on one side of the base 1411 facing the color film substrate 12.

The photodiode 142 includes a base 1411, and the insulating layer 1413, a source/drain electrode layer 1421, an N-type layer 1422, an intermediate layer 1423, a P-type layer 1424, a contact electrode 1425, a third passivation layer 1426, and a second shading layer 1427 successively formed on the base 1411.

The contact electrode 1425 and the third passivation layer 1426 are successively formed on the first shading layer 1418.

The source/drain electrode 1415 and the source/drain electrode layer 1421 are electrically connected together and formed on a same layer. The first shading layer 1418 is configured to block light from reaching the thin film transistor 141 and some parts of the second passivation layer 1417 which do not need light irradiation. The first shading layer 1418 is applied to the thin film transistor 141 and to avoid light transported from the backlight into the thin film transistor 141. The second shading layer 1427 s configured to block the photodiode 142 from light, and to avoid light transported from the backlight into the intermediate layer 1423 of the photodiode 142, which causes an erroneous judgement.

The thin film transistor 141 further includes a thirds shading layer 1419. The third shading layer 1419 is formed between the gate electrode 1412 and the base 1411. The third shading layer 1419 is configured to block light from reaching the thin film transistor 141 and some parts of the first passivation layer 1417 which do not need light irradiation. The third shading layer 1419 is configured to prevent from external light reaching the metal of the thin film transistor 141 to generate a reflected light.

In one exemplary embodiment of the liquid crystal display panel 100, the intermediate layer 1423 is made of one of Si-based material, organic o-phenylenediamine (OPD), and perovskite.

The N-type layer 1422 is a layer containing one electron transport material or several electron transport materials. The electron transport material is a single hole transport compound or element, or a mixture containing two or more electron transport compound or elements. The electron transport compound or element is non-doped or one or several dopant elements doped.

The P-type layer 1424 is a hole transport material layer, the hole transport material is a single hole transport compound or element, or a mixture containing two or more hole transport compound or elements. The hole transport compound or element is non-doped or one or several dopant elements doped.

The intermediate layer 1423 is made of perovskite. The intermediate layer 1423 includes at least one kind of anions obtained from halogenated anions and sulfide anions. The intermediate layer 1423 includes a plurality of first cations, a plurality of second cations, and at least one kind of anions of the above. The first cations are organic cations, such as hydrogen, nitrogen, or oxygen. The second cations are divalent metal cations, that is one of $Ca^{2+}$, $Sr^{2+}$, $Cd^{2+}$, $Sn^{2+}$, and $Pb^{2+}$.

In the present exemplary embodiment, the perovskite is $CH_3NH_3PbCl_2I$, $CH_3NH_3PbBrCl_2$, $CH_3NH_3SnF_2Br$ and $CH_3NH_3PbBrI_2$.

A thickness of the intermediate layer 1423 is between 250 nanometers and 3 microns. Alternatively, the thickness of the intermediate layer 1423 can be 300 nanometers, 350 nanometers, 450 nanometers, 500 nanometers, 600 nanometers, or 1 micron.

In the present exemplary embodiment of the liquid crystal display panel, a first forming region of the base 1411 is configured to form the thin film transistors 141, and the second forming region is configured to form the photodiodes 142. The process for manufacturing the fingerprint identification module 14 is:

a first step, a third shading layer 1419 is formed on a first forming region of a base 1411;

a second step, a patterned gate electrodes 1412 are formed on the third shading layer 1419;

a third step, a patterned insulating layer 1413 is formed on the gate electrodes 1412 and the second forming region of the base 1411;

a fourth step, a patterned active layer 1414 is formed on the insulating layer 1413 corresponding to the first forming region;

a fifth step, a source/drain electrodes 1415 is formed on the active layer 1414 and simultaneously a plurality of source/drain electrodes 1421 are formed on the insulating layer 1413;

a sixth step, a passivation layer 1416 is formed on the source/drain electrodes 1415;

a seventh step, a N-type layer 1422, an intermediate layer 1423 and a P-type layer 1424 are successively formed on the source/drain electrodes layer 1421 corresponding to the second forming region;

an eighth step, a second passivation layer 1417 and a first shading layer 1418 are successively formed on the first passivation layer 1416;

a ninth step, a plurality of contact electrodes 1425 are formed on the first shading layer 1418 and the P-type layer 1424;

a tenth step, a patterned third passivation layer 1426 is formed on the contact electrodes 1425; and Finally, a second shading layer 1427 is formed on the third passivation layer 1426 corresponding to the second forming region.

Thus, the process for manufacturing the fingerprint identification module 14 of the present embodiment is completed.

Figure 4:
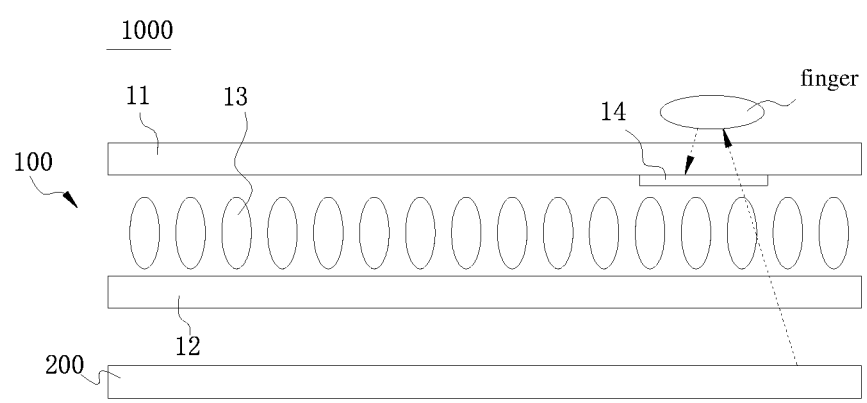
FIG. 4 is a structural schematic view of a liquid crystal display device of one exemplary embodiment of the present disclosure.

Referring to FIG. 4, FIG. 4 is a structural schematic view of a liquid crystal display device of one exemplary embodiment of the present disclosure. The liquid crystal display device 1000 of one exemplary embodiment of the present disclosure includes a liquid crystal display panel 100 and a light source 200. The light source 200 provides light for the liquid crystal display panel 100, and the light source 200 is located below the liquid crystal display panel 100.

The liquid crystal display panel 100 includes an array substrate 11, a color film substrate 12, a liquid crystal 13 and a plurality of fingerprint identification modules 14.

The array substrate 11 is disposed on one side of facing a user. The color film substrate 12 is disposed on one side of back to the user. The liquid crystal 11 is positioned between the array substrate 11 and the color film substrate 12. The fingerprint identification module 14 is formed on one side of the array substrate 11 facing the liquid crystal 13, and that is to shorten paths of light reflected by a finger to a photodiode of the fingerprint identification module 142.

The fingerprint identification module 14 includes a thin film transistor 141 and a photodiode 142 configured for converting light energy into electrical energy. The thin film transistor 141 is electrically connected to an output end of the photodiode 142.

The fingerprint identification module 14 is formed in a display region of the liquid crystal display panel 100.

The liquid crystal display panel 100 of the present application is provided by forming the array substrate 11 which configures the fingerprint identification modules 14 positioned to face the user, that is to shorten the paths of light reflected by the finger and to reduce a loss of light intensity, and that is to improve the sensitivity of the fingerprint identification module 14.

Furthermore, the fingerprint identification module 14 is disposed on the array substrate 11 to make the thin film transistor 141 of the fingerprint identification module 14 and the thin film transistor of the array substrate 11 to be manufactured by a same process, and that is to save a manufacturing time and improve a manufacturing efficiency. Both of them share one base 1411 to save materials.

In the embodiments of the liquid crystal display device 1000, the structure and manufacturing method of the fingerprint identification modules 14 are consistent with the structure and manufacturing method of the fingerprint identification module of the liquid crystal display panel of the above, for details, please refer to the contents of the fingerprint identification modules of the above embodiments. The embodiment of the liquid crystal display device 1000 will not be described again.

Compared with the liquid crystal display panel of prior art, in the liquid crystal display panel and the liquid crystal display device of the present application, the array substrate with the fingerprint identification modules is positioned to face the user, that is to shorten paths of light reflected from the finger and to improve the sensitivity of the fingerprint identification module; furthermore, the first shading layer and the second shading layer are configured to prevent from the backlight reaching to the photodiodes to cause a misjudgment of the photodiodes; the third shading layer is configured to prevent from the metal reflecting light, such as the gate electrodes, the source/drain electrodes, and so on. Solving the problem that light needs to penetrate through a color film substrate from a array substrate to reach a finger, and light reflected by the finger penetrates from the color film substrate to the optical fingerprint identification module configured on the array substrate, and then which is detected by the photodiode, the light intensity detected by such a light path is very weak and sensitivity is very poor.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:

1. A liquid crystal display panel, comprising:
an array substrate disposed at one side facing an user of the liquid crystal display panel;
a color film substrate disposed at one side facing away from the user;
liquid crystals positioned between the array substrate and the color film substrate; and
a fingerprint identification module formed on one side of the array substrate facing the liquid crystal to shorten paths of light reflected by a finger to a photodiode of the fingerprint identification module;
wherein the fingerprint identification module comprises a thin film transistor and the photodiode configured for converting light energy into electrical energy, the thin-film transistor is electrically connected to an output end of the photodiode;
wherein the thin film transistor comprises a base, and a gate electrode, an insulating layer, an active layer, a source/drain electrode, a first passivation layer, a second passivation layer and a first shading layer successively formed on one side of the base facing the color film substrate;
wherein the photodiode comprises the base, and the insulating layer, a source/drain electrode layer, an N-type layer, an intermediate layer, a P-type layer, a contact electrode, a third passivation layer and a second shading layer successively formed on the base;
wherein the contact electrode and the third passivation layer are successively formed on the first shading layer;
wherein the source/drain electrode and the source/drain electrode layer are electrically connected together and formed on a same layer, and the first shading layer is configured to block light from reaching the thin film transistor and some parts of the second passivation layer which do not need light irradiation, and the second shading layer is configured to block the photodiode from light;

wherein the thin film transistor further comprises a third shading layer, the third shading layer is formed between the gate electrode and the base, and the third shading layer is configured to block light from reaching the thin film transistor and some parts of the first passivation layer which do not need light irradiation; and wherein the intermediate layer is made of one of Si-based material, organic o-phenylenediamine (OPD), and perovskite.

2. The liquid crystal display panel of claim 1, wherein the intermediate layer is made of perovskite, and a thickness of the intermediate layer is between 250 nanometers and 3 microns.

3. The liquid crystal display panel of claim 1, wherein the N-type layer is a layer containing one electron transport material or several electron transport materials.

4. The liquid crystal display panel of claim 1, wherein the P-type layer is a hole transport material layer, the hole transport material is a single hole transport compound or element, or a mixture containing two or more hole transport compound or elements.

5. The liquid crystal display panel of claim 2, wherein the intermediate layer comprises at least one kind of anions obtained from halogenated anions and sulfide anions.

6. A liquid crystal display panel, comprising:
an array substrate disposed at one side facing an user of the liquid crystal display panel;
a color film substrate disposed at one side facing away from the user;
liquid crystals positioned between the array substrate and the color film substrate; and
a fingerprint identification module formed on one side of the array substrate facing the liquid crystal to shorten paths of light reflected by a finger to a photodiode of the fingerprint identification module;
wherein the fingerprint identification module comprises a thin film transistor and the photodiode configured for converting light energy into electrical energy, the thin-film transistor is electrically connected to an output end of the photodiode.

7. The liquid crystal display panel of claim 6, wherein the thin film transistor comprises a base, and a gate electrode, an insulating layer, an active layer, a source/drain electrode, a first passivation layer, a second passivation layer and a first shading layer successively formed on one side of the base facing the color film substrate;
wherein the photodiode comprises the base, and the insulating layer, a source/drain electrode layer, an N-type layer, an intermediate layer, a P-type layer, a contact electrode, a third passivation layer and a second shading layer successively formed on the base;
wherein the contact electrode and the third passivation layer are successively formed on the first shading layer;
wherein the source/drain electrode and the source/drain electrode layer are electrically connected together and formed on a same layer, and the first shading layer is configured to block light from reaching the thin film transistor and some parts of the second passivation layer which do not need light irradiation, and the second shading layer is configured to block the photodiode from light.

8. The liquid crystal display panel of claim 7, wherein the thin film transistor further comprises a third shading layer, the third shading layer is formed between the gate electrode and the base, and the third shading layer is configured to block light from reaching the thin film transistor and some parts of the first passivation layer which do not need light irradiation.

9. The liquid crystal display panel of claim 7, wherein the intermediate layer is made of one of Si-based material, organic o-phenylenediamine (OPD), and perovskite.

10. The liquid crystal display panel of claim 9, wherein the intermediate layer is made of perovskite, and a thickness of the intermediate layer is between 250 nanometers and 3 microns.

11. A liquid crystal display device, comprising a liquid crystal panel and a light source, wherein the liquid crystal panel comprises:
an array substrate disposed at one side facing an user of the liquid crystal display panel;
a color film substrate disposed at one side facing away from the user;
liquid crystals positioned between the array substrate and the color film substrate; and
a fingerprint identification module formed on one side of the array substrate facing the liquid crystal to shorten paths of light reflected by a finger to a photodiode of the fingerprint identification module;
wherein the fingerprint identification module comprises a thin film transistor and the photodiode configured for converting light energy into electrical energy, the thin-film transistor is electrically connected to an output end of the photodiode.

12. The liquid crystal display device of claim 11, wherein the thin film transistor comprises a base, and a gate electrode, an insulating layer, an active layer, a source/drain electrode, a first passivation layer, a second passivation layer and a first shading layer successively formed on one side of the base facing the color film substrate;
wherein the photodiode comprises the base, and the insulating layer, a source/drain electrode layer, an N-type layer, an intermediate layer, a P-type layer, a contact electrode, a third passivation layer and a second shading layer successively formed on the base;
wherein the contact electrode and the third passivation layer are successively formed on the first shading layer;
wherein the source/drain electrode and the source/drain electrode layer are electrically connected together and formed on a same layer, and the first shading layer is configured to block light from reaching the thin film transistor and some parts of the second passivation layer which do not need light irradiation, and the second shading layer is configured to block the photodiode from light.

13. The liquid crystal display device of claim 12, wherein the thin film transistor further comprises a third shading layer, the third shading layer is formed between the gate electrode and the base, and the third shading layer is configured to block light from reaching the thin film transistor and some parts of the first passivation layer which do not need light irradiation.

14. The liquid crystal display device of claim 12, wherein the intermediate layer is made of one of Si-based material, organic o-phenylenediamine (OPD), and perovskite.

15. The liquid crystal display device of claim 14, wherein the intermediate layer is made of perovskite, and a thickness of the intermediate layer is between 250 nanometers and 3 microns.

* * * * *